(12) United States Patent
Hai et al.

(10) Patent No.: US 11,495,044 B2
(45) Date of Patent: Nov. 8, 2022

(54) FINGERPRINT SENSING DISPLAY APPARATUS, METHOD OF USING FINGERPRINT SENSING DISPLAY APPARATUS, AND METHOD OF FABRICATING FINGERPRINT SENSING DISPLAY APPARATUS

(71) Applicant: BOE Technology Group Co., Ltd., Beijing (CN)

(72) Inventors: Xiaoquan Hai, Beijing (CN); Xue Dong, Beijing (CN); Haisheng Wang, Beijing (CN); Lei Wang, Beijing (CN); Changfeng Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 242 days.

(21) Appl. No.: 16/769,210

(22) PCT Filed: Sep. 12, 2019

(86) PCT No.: PCT/CN2019/105627
§ 371 (c)(1),
(2) Date: Jun. 2, 2020

(87) PCT Pub. No.: WO2020/073771
PCT Pub. Date: Apr. 16, 2020

(65) Prior Publication Data
US 2021/0174049 A1    Jun. 10, 2021

(30) Foreign Application Priority Data

Oct. 11, 2018   (CN) .......................... 201811184918.0

(51) Int. Cl.
*G06V 40/13*    (2022.01)
*H01L 27/32*    (2006.01)
(Continued)

(52) U.S. Cl.
CPC ...... *G06V 40/1318* (2022.01); *H01L 27/3218* (2013.01); *H01L 51/5284* (2013.01); *H01L 51/56* (2013.01)

(58) Field of Classification Search
CPC ............. G06K 9/0004; G06K 9/00046; G06K 9/00006; G06V 40/1318; G06V 40/12;
(Continued)

(56) References Cited

U.S. PATENT DOCUMENTS

| 2008/0317303 | A1 | 12/2008 | Konno et al. | |
| 2010/0308513 | A1* | 12/2010 | Kashiwagi | B82Y 10/00 264/496 |

(Continued)

FOREIGN PATENT DOCUMENTS

| CN | 101178455 A | 5/2008 |
| CN | 101561524 A | 10/2009 |

(Continued)

OTHER PUBLICATIONS

International Search Report & Written Opinion dated Nov. 28, 2019, regarding PCT/CN2019/105627.

(Continued)

*Primary Examiner* — Yuzhen Shen
(74) *Attorney, Agent, or Firm* — Intellectual Valley Law, P.C.

(57) ABSTRACT

A fingerprint sensing display apparatus having a plurality of subpixel regions spaced apart by an inter-subpixel region is provided. The fingerprint sensing display apparatus includes a counter substrate; an array substrate facing the counter substrate, wherein the array substrate includes a plurality of light emitting elements configured to emit light toward the counter substrate, at least a portion of the light being totally reflected by a surface of the counter substrate away from the array substrate; a plurality of photosensors on a side of the
(Continued)

array substrate away from the counter substrate; and a first light shielding layer and a second light shielding layer between the plurality of photosensors and the plurality of light emitting elements, the second light shielding layer is on a side of the first light shielding layer away from the plurality of light emitting elements.

20 Claims, 13 Drawing Sheets

(51) Int. Cl.
 *H01L 51/52* (2006.01)
 *H01L 51/56* (2006.01)
(58) Field of Classification Search
 CPC ............. H01L 27/3227; H01L 27/3234; H01L 29/78633; H01L 27/14623; G02F 1/133512; G02F 1/136209
 See application file for complete search history.

(56) References Cited

U.S. PATENT DOCUMENTS

| | | |
|---|---|---|
| 2014/0078434 A1 | 3/2014 | Qin |
| 2017/0017824 A1 | 1/2017 | Smith et al. |
| 2017/0169273 A1 | 6/2017 | Wu |
| 2018/0012069 A1* | 1/2018 | Chung ................. A61B 5/1172 |
| 2018/0196985 A1 | 7/2018 | Ling et al. |
| 2019/0019009 A1 | 1/2019 | Wu et al. |
| 2019/0050621 A1 | 2/2019 | Xu et al. |
| 2019/0165056 A1* | 5/2019 | Lee ..................... H01L 51/5253 |
| 2019/0243154 A1 | 8/2019 | Hai et al. |
| 2019/0347462 A1* | 11/2019 | Tseng ...................... G02B 27/30 |
| 2020/0104562 A1* | 4/2020 | Sung .................... H01L 27/3227 |
| 2020/0219948 A1* | 7/2020 | Kim ...................... G09G 3/3283 |
| 2020/0342195 A1 | 10/2020 | Wu |
| 2021/0043875 A1* | 2/2021 | Lee ..................... G06V 40/1306 |

FOREIGN PATENT DOCUMENTS

| | | |
|---|---|---|
| CN | 102879944 A | 1/2013 |
| CN | 103389827 A | 11/2013 |
| CN | 106874828 A | 6/2017 |
| CN | 106886767 A | 6/2017 |
| CN | 107077605 A | 8/2017 |
| CN | 206470779 U | 9/2017 |
| CN | 107292216 A | 10/2017 |
| CN | 107609456 A | 1/2018 |
| CN | 206975658 U | 2/2018 |
| CN | 107844767 A | 3/2018 |
| CN | 107958189 A | 4/2018 |
| CN | 108227230 A | 6/2018 |
| CN | 108241824 A | 7/2018 |
| CN | 108629243 A | 10/2018 |

OTHER PUBLICATIONS

First Office Action in the Chinese Patent Application No. 201811184918.0 dated Nov. 25, 2019; English translation attached.
Second Office Action in the Chinese Patent Application No. 201811184918.0 dated Aug. 10, 2020; English translation attached.
Decision of Rejection in the Chinese Patent Application No. 201811184918.0, dated Nov. 3, 2020; English translation attached.

* cited by examiner

FINGERPRINT SENSING DISPLAY APPARATUS, METHOD OF USING FINGERPRINT SENSING DISPLAY APPARATUS, AND METHOD OF FABRICATING FINGERPRINT SENSING DISPLAY APPARATUS

CROSS-REFERENCE TO RELATED APPLICATION

This application is a national stage application under 35 U.S.C. § 371 of International Application No. PCT/CN2019/105627, filed Sep. 12, 2019, which claims priority to Chinese Patent Application No. 201811184918.0, filed Oct. 11, 2018. Each of the forgoing applications is herein incorporated by reference in its entirety for all purposes.

TECHNICAL FIELD

The present invention relates to display technology, more particularly, to a fingerprint sensing display apparatus, a method of using a fingerprint sensing display apparatus, and a method of fabricating a fingerprint sensing display apparatus.

BACKGROUND

In recent years, various methods have been proposed in fingerprint and palm print recognition. Examples of optical method for recognizing fingerprint and palm print include total reflection method, light-path separation method, and scanning method. In a total reflection method, light from a light source such as ambient light enters into a pixel, and is totally reflected on the surface of a package substrate. When a finger or palm touches the display panel, the total reflection condition of the surface changes locally upon touch, leading to a disruption of the total reflection locally. The disruption of the total reflection results in a reduced reflection. Based on this principle, the ridge lines of a finger may be differentiated from the valley lines. Alternatively, fingerprint and palm print may be recognized by detecting changes in capacitance when a finger or palm touches the display panel.

SUMMARY

In one aspect, the present invention provides a fingerprint sensing display apparatus having a plurality of subpixel regions spaced apart by an inter-subpixel region, comprising a counter substrate; an array substrate facing the counter substrate, wherein the array substrate comprises a plurality of light emitting elements configured to emit light toward the counter substrate, at least a portion of the light being totally reflected by a surface of the counter substrate away from the array substrate; a plurality of photosensors on a side of the array substrate away from the counter substrate; and a first light shielding layer and a second light shielding layer between the plurality of photosensors and the plurality of light emitting elements, the second light shielding layer is on a side of the first light shielding layer away from the plurality of light emitting elements; wherein the first light shielding layer comprises a plurality of first light transmitting regions and a plurality of first light absorbing barriers alternatively arranged; the plurality of first light absorbing barriers are spaced apart from each other, and are arranged along a first direction; and the plurality of first light transmitting regions are spaced apart from each other, and are arranged along the first direction; wherein the second light shielding layer comprises a plurality of second light transmitting regions and a plurality of first light absorbing barriers alternatively arranged; wherein the plurality of second light absorbing barriers are spaced apart from each other, and are arranged along a second direction; and the plurality of second light transmitting regions are spaced apart from each other, and are arranged along the second direction; wherein the plurality of first light absorbing barriers and the plurality of second light absorbing barriers cross over each other, forming a plurality of intersection regions configured to block at least a portion of diffusedly reflected light from passing there-through, and defining a plurality of light path apertures configured to allow at least the portion of the light totally reflected by the surface of the counter substrate away from the array substrate to pass therethrough, thereby forming a signal-enriched light beam in a respective one of the plurality of intersection regions, an orthographic projection of a respective one of the plurality of first light absorbing barriers on the array substrate overlaps with an orthographic projection of a respective one of the plurality of second light absorbing barriers on the array substrate; and the plurality of photosensors are configured to detect the signal-enriched light beam, thereby detecting a fingerprint information.

Optionally, a respective one of the plurality of light path apertures is in the inter-subpixel region.

Optionally, at least one of the plurality of light emitting elements is at least partially in the respective one of the plurality of intersection regions.

Optionally, in the plurality of intersection regions, the first light shielding layer and the second light shielding layer are in direct contact.

Optionally, the fingerprint sensing display apparatus further comprises an intermediate layer; wherein the intermediate layer is a substantially transparent substrate; and the intermediate layer is between the first light shielding layer and the second light shielding layer.

Optionally, the fingerprint sensing display apparatus further comprises an intermediate layer; wherein the intermediate layer is a substantially transparent substrate; and the intermediate layer is on a side of the first light shielding layer away from the second light shielding layer.

Optionally, the intermediate layer is a base substrate of the array substrate.

Optionally, an orthographic projection of a respective one of the plurality of first light absorbing barriers on the counter substrate at least partially overlaps with an orthographic projection of one of the plurality of light emitting elements on the counter substrate; and an orthographic projection of a respective one of the plurality of second light absorbing barriers on the counter substrate at least partially overlaps with an orthographic projection of one of the plurality of light emitting elements on the counter substrate.

Optionally, the first light shielding layer and the second light shielding layer comprise a black material.

Optionally, the first light shielding layer comprises a plurality of first light transmitting regions configured to allow at least the portion of the light totally reflected by the surface of the counter substrate away from the array substrate to pass therethrough, thereby forming a signal-enriched light bar.

Optionally, the second light shielding layer comprises a plurality of second light transmitting regions configured to allow at least a portion of the signal-enriched light bar to pass therethrough, thereby forming the signal-enriched light beam.

Optionally, a thickness of the first light shielding layer satisfies the following condition:

$$h1 = k1/\tan(\tfrac{1}{2}\beta 1) \quad (1);$$

a thickness of the second light shielding layer satisfies the following condition:

$$h2 = k2/\tan(\tfrac{1}{2}\beta 2) \quad (2);$$

wherein h1 is a thickness of the first light shielding layer; k1 is a width, along the first direction, of a respective one of the plurality of first light transmitting regions; and β1 is the first light receiving angle of the second light shielding layer; h2 is a thickness of the second light shielding layer; k2 is a width, along the second direction, of a respective one of the plurality of second light transmitting regions; β2 is the second light receiving angle of the second light shielding layer; wherein the first light receiving angle β1 is an included angle between two first edge light beams in a same plane parallel to the first direction, the two first edge light beams are two light beams having greatest incident angles with respect to the surface of the first light shielding layer and transmitting through a same one of the plurality of first light transmitting regions; and the second light receiving angle β2 is an included angle between two second edge light beams in a same plane parallel to the second direction, the two second edge light beams are two light beams having greatest incident angles with respect to the surface of the second light shielding layer and transmitting through a same one of the plurality of second light transmitting regions.

Optionally, β1 is 11.4°, k1 is 5 μm, h1 is 50 μm, β2 is 11.4°, k2 is 5 μm, h2 is 50 μm, h1 is 50 μm, and h2 is 50 μm.

In another aspect, the present invention provides a method of fabricating a fingerprint sensing display apparatus having a plurality of subpixel regions spaced apart by an inter-subpixel region, comprising forming an array substrate comprising a plurality of light emitting elements; forming a counter substrate on the array substrate comprising a surface away from the array substrate configured to totally reflect at least a portion of light emitted from the plurality of light emitting elements; forming a first light shielding layer on a side of the plurality of light emitting elements away from the counter substrate; forming a second light shielding layer on a side of the first light shielding layer away from the plurality of light emitting elements; and forming a plurality of photosensors on a side of the second light shielding layer away from the first light shielding layer; wherein the first light shielding layer is formed to comprise a plurality of first light absorbing barriers spaced apart from each other, the plurality of first light absorbing barriers are arranged along a first direction; and the second light shielding layer is formed to comprise a plurality of second light absorbing barriers spaced apart from each other, the plurality of second light absorbing barriers are arranged along a second direction; wherein the plurality of first light absorbing barriers and the plurality of second light absorbing barriers cross over each other to form a plurality of intersection regions configured to block at least a portion of diffusedly reflected light from passing there-through, and to define a plurality of light path apertures configured to allow at least the portion of the light totally reflected by the surface of the counter substrate away from the array substrate to pass therethrough, thereby forming a signal-enriched light beam; in a respective one of the plurality of intersection regions, an orthographic projection of a respective one of the plurality of first light absorbing barriers on the array substrate overlaps with an orthographic projection of a respective one of the plurality of second light absorbing barriers on the array substrate; and the plurality of photosensors are configured to detect the signal-enriched light beam, thereby detecting a fingerprint information.

Optionally, forming the first light shielding layer comprises forming a first light shielding material layer on the side of the plurality of light emitting elements away from the counter substrate; patterning the first light shielding material layer to form the plurality of first light absorbing barriers arranged along the first direction and a plurality of first slits arranged along the first direction, the plurality of first light absorbing barriers and the plurality of first slits being alternatively arranged; and forming a plurality of first light transmitting regions in the plurality of first slits, thereby forming the first light shielding layer; wherein the plurality of first light absorbing barriers and the plurality of first light transmitting regions are alternatively arranged.

Optionally, forming the second light shielding layer comprises forming a second light shielding material layer on the side of the first light shielding layer away from the plurality of light emitting elements; patterning the second lights shielding material layer to form the plurality of second light absorbing barriers arranged along the second direction and a plurality of second slits arranged along the second direction, the plurality of second light absorbing barriers and the plurality of second slits being alternatively arranged; and forming a plurality of second light transmitting regions in the plurality of second slits, thereby forming the second light shielding layer; wherein the plurality of second light absorbing barriers and the plurality of second light transmitting regions are alternatively arranged.

Optionally, the method further comprises forming an intermediate layer between the first light shielding layer and the second light shielding layer; wherein the intermediate layer is a substantially transparent substrate.

Optionally, the method further comprises forming an intermediate layer on a side of the first light shielding layer away from the second light shielding layer; wherein the intermediate layer is a substantially transparent substrate.

Optionally, the intermediate layer is a base substrate of the array substrate.

Optionally, patterning the first light shielding material layer is performed by a nanoimprint process, and patterning the second light shielding material layer is performed by a nanoimprint process.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
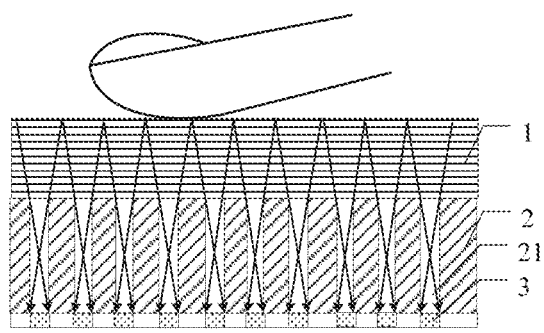
FIG. 1 is a schematic diagram of a fingerprint sensing apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

There is a distance between a finger touch region or a palm touch region of the surface of a package substrate and a photosensor, so the photosensor not only receives light from a corresponding region of the surface of the package substrate, but also receives light reflected from other regions or light diffusedly reflected by elements in the package substrate, resulting that the photosensor cannot detect and obtain a clear image of the fingerprint or a palm print.

Accordingly, the present disclosure provides, inter alia, a fingerprint sensing display apparatus, a method of using a fingerprint sensing display apparatus, and a method of fabricating a fingerprint sensing display apparatus that substantially obviate one or more of the problems due to limitations and disadvantages of the related art. In one aspect, the present disclosure provides a fingerprint sensing display apparatus having a plurality of subpixel regions spaced apart by an inter-subpixel region. In some embodiments, the fingerprint sensing display apparatus includes a counter substrate; an array substrate facing the counter substrate; a plurality of photosensors on a side of the array substrate away from the counter substrate; a first light shielding layer and a second light shielding layer between the plurality of photosensors and the plurality of light emitting elements. Optionally, the array substrate includes a plurality of light emitting elements configured to emit light toward the counter substrate. Optionally, at least a portion of the light is totally reflected by a surface of the counter substrate away from the array substrate. Optionally, the second light shielding layer is on a side of the first light shielding layer away from the plurality of light emitting elements. Optionally, the first light shielding layer includes a plurality of first light absorbing barriers spaced apart from each other. Optionally, the plurality of first light absorbing barriers are arranged along a first direction. Optionally, the second light shielding layer includes a plurality of second light absorbing barriers spaced apart from each other. Optionally, the plurality of second light absorbing barriers are arranged along a second direction. Optionally, the plurality of first light absorbing barriers and the plurality of second light absorbing barriers cross over each other, forming a plurality of intersection regions configured to block at least a portion of diffusedly reflected light from passing there-through, and defining a plurality of light path apertures configured to allow at least the portion of the light totally reflected by the surface of the counter substrate away from the array substrate to pass therethrough, to form a signal-enriched light beam. Optionally, in a respective one of the plurality of intersection regions, an orthographic projection of a respective one of the plurality of first light absorbing barriers on the array substrate overlaps with an orthographic projection of a respective one of the plurality of second light absorbing barriers on the array substrate. Optionally, the plurality of photosensors are configured to detect the signal-enriched light beam, thereby detecting a fingerprint information.

It is disclosed in the present disclosure that a collimator is disposed between a plurality of photosensors and a finger touching on a counter substrate of a fingerprint sensing display apparatus, to block light reflected by regions other than a corresponding finger touch region, to further ensure that the plurality of photosensors can detect and obtain a clear image of a fingerprint image.

FIG. 1 is a schematic diagram of a fingerprint sensing apparatus in some embodiments according to the present disclosure. Referring to FIG. 1, the fingerprint sensing apparatus includes an array of a plurality of photosensors 3, a collimator 2 on the plurality of photosensor 3, and an array substrate 1 (e.g., OLED substrate) on a side of the collimator 2 away from the plurality of photosensors 3. Optionally, the array substrate includes a plurality light emitting elements, e.g., OLED.

Optionally, the collimator 2 includes a plurality of holes 21. For example, light reflected by a valley of the fingerprint and light reflected by a ridge of the fingerprint adjacent to the valley of the fingerprint can be transmitted through different holes 21 of the plurality of holes 21, and be detected by different regions of the array of the plurality of photosensors 3.

It is discovered by the present disclosure that in order for the plurality of holes 21 to have a relatively high ration of height to width, special materials may be used to form the collimator 2, and processes of fabricating the plurality of holes 21 is complicated. For example, in the process of fabricating the plurality of holes 21, a first opening of one of the plurality of holes 21 on a surface of the collimator 2 closer to the array substrate 1 is greater than a second opening of the one of the plurality of holes 21 on a surface of the collimator 2 closer to the plurality of photosensors 21, so an incident angle of light which can transmit through the one of the plurality of holes is increased, and a light reflected by a valley line of a fingerprint and a light reflected by a ridge line of the fingerprint adjacent to the valley line may enter the same hole of the plurality of holes 21, resulting in cross-talk between information of the valley line of the fingerprint and information of the ridge of the fingerprint adjacent to the valley line. So, the plurality of photosensors cannot accurately detect fingerprint information and obtain clear fingerprint image due to the cross-talk.

Figure 2:
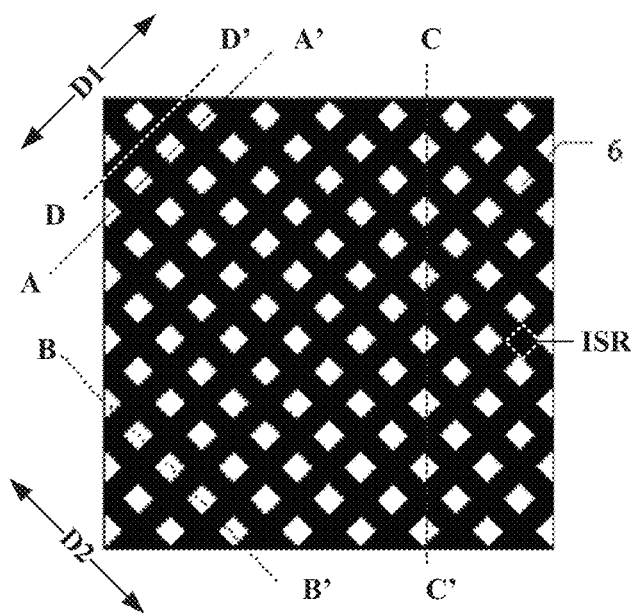
FIG. 2 is a plan view of a first light shielding layer and a second light shielding layer in some embodiments according to the present disclosure.
Figure 3A:
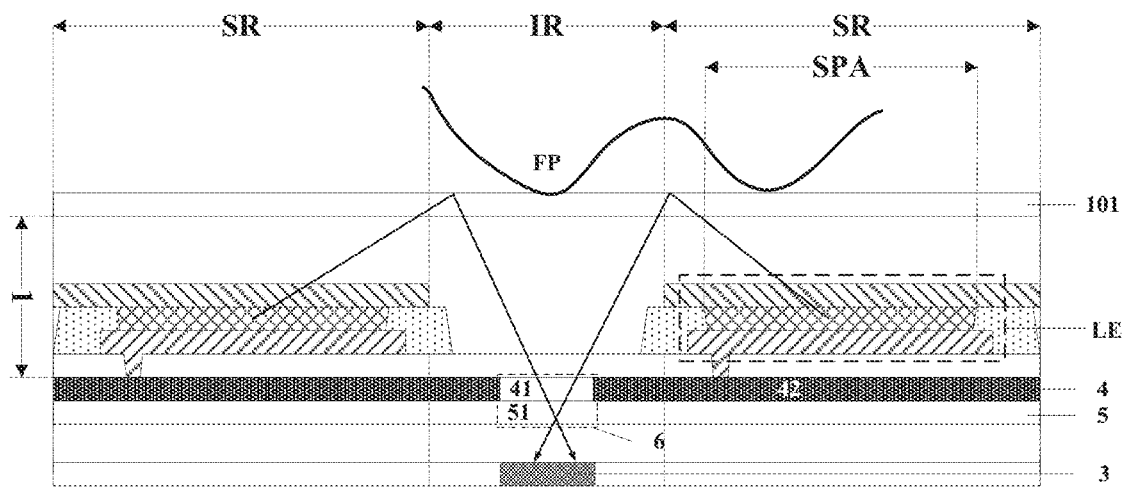
FIG. 3A is a cross-sectional view of a fingerprint sensing apparatus along an A-A' line in FIG. 2.
Figure 3B:
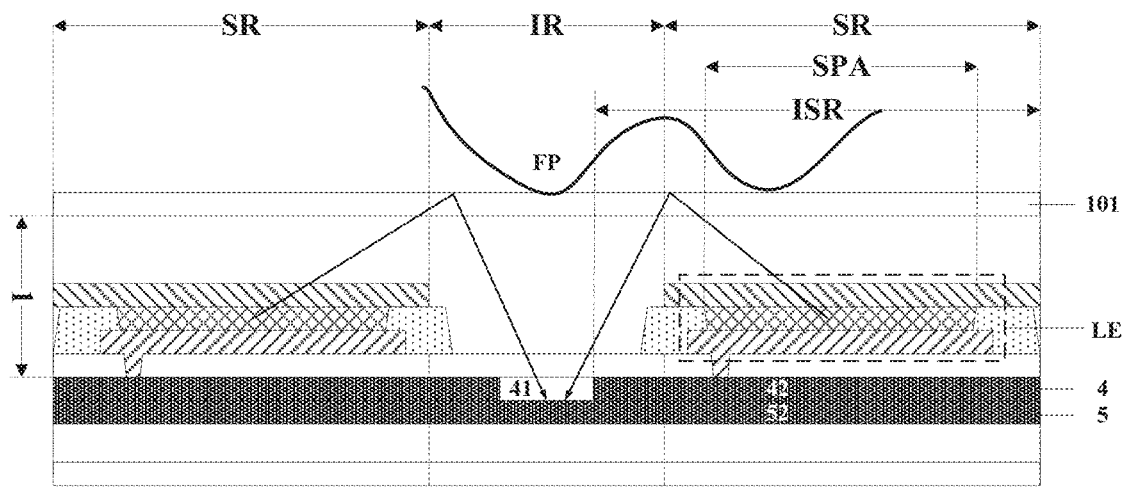
FIG. 3B is a cross-sectional view of a fingerprint sensing apparatus along a D-D' line in FIG. 2.
Figure 3C:
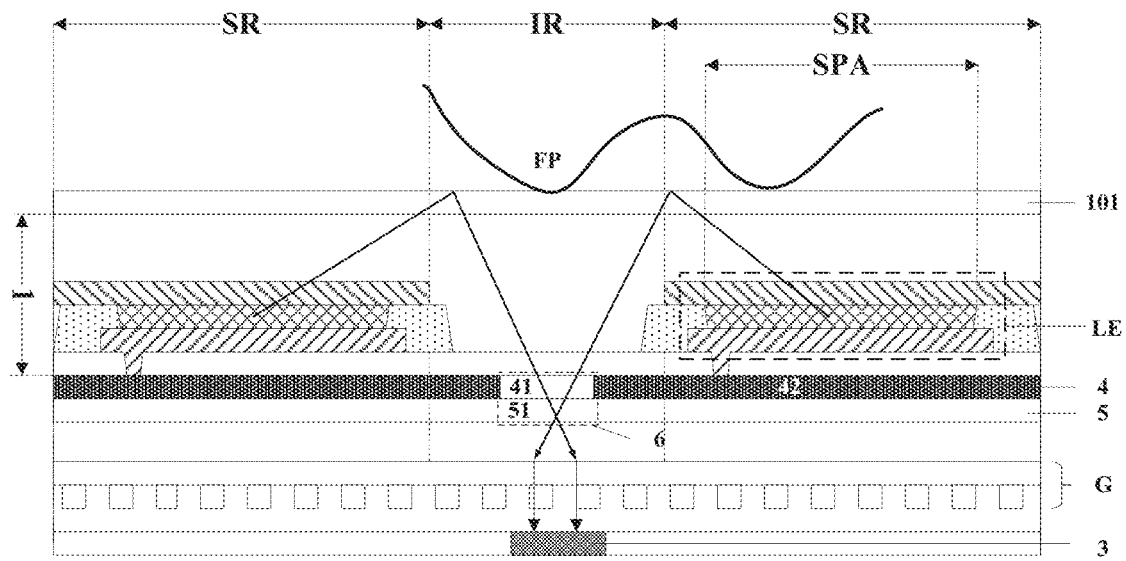
FIG. 3C is a cross-sectional view of a fingerprint sensing apparatus along an A-A' line in FIG. 2.

FIG. 3A is a cross-sectional view of a fingerprint sensing apparatus along an A-A' line in FIG. 2. FIG. 3B is a cross-sectional view of a fingerprint sensing apparatus along a D-D' line in FIG. 2. FIG. 3C is a cross-sectional view of a fingerprint sensing apparatus along an A-A' line in FIG. 2. Referring to FIG. 3A and FIG. 3C, in some embodiments, a fingerprint sensing display apparatus having a plurality of subpixel regions SR spaced apart by an inter-subpixel region IR.

In some embodiments, the fingerprint sensing display apparatus includes a counter substrate 101, an array substrate 1 facing the counter substrate 101. Optionally, the array substrate 1 includes a plurality of light emitting elements LE configured to emit light toward the counter substrate 101. Optionally, at least a portion of the light is totally reflected by a surface of the counter substrate 101 away from the array substrate 1.

In some embodiments, the fingerprint sensing display apparatus includes a plurality of photosensors 3 on a side of the array substrate 1 away from the counter substrate 101.

In some embodiments, the fingerprint sensing display apparatus includes a first light shielding layer 4 and a second light shielding layer 5 between the plurality of photosensors 3 and the plurality of light emitting elements LE. Optionally, the second light shielding layer 5 is on a side of the first light shielding layer 4 away from the plurality of light emitting elements LE.

Figure 4A:
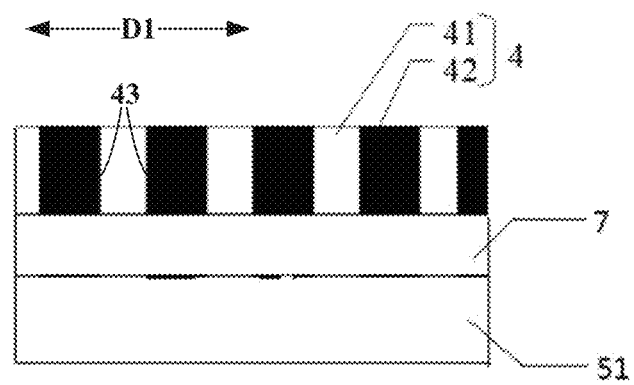
FIG. 4A is a cross-sectional view of the first light shielding layer and the second light shielding layer along an A-A' line in FIG. 2.
Figure 4B:
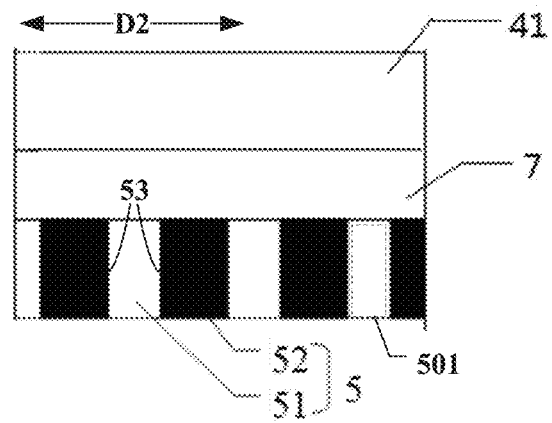
FIG. 4B is a cross-sectional view of the first light shielding layer and the second light shielding layer along a B-B' line in FIG. 2.
Figure 4C:
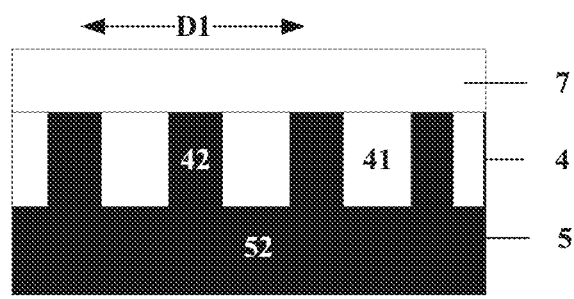
FIG. 4C is a cross-sectional view of a first light shielding layer and a second light shielding layer along a D-D' line in FIG. 2.
Figure 5:
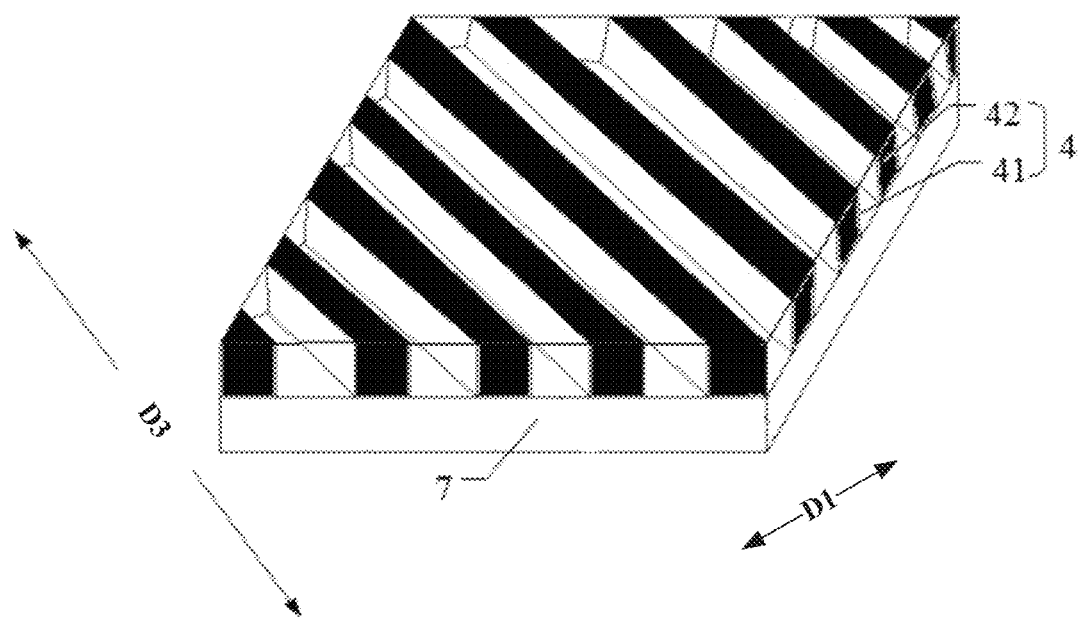
FIG. 5 is a perspective view of a first light shielding layer on an intermediate layer in some embodiments according to the present disclosure.
Figure 6:
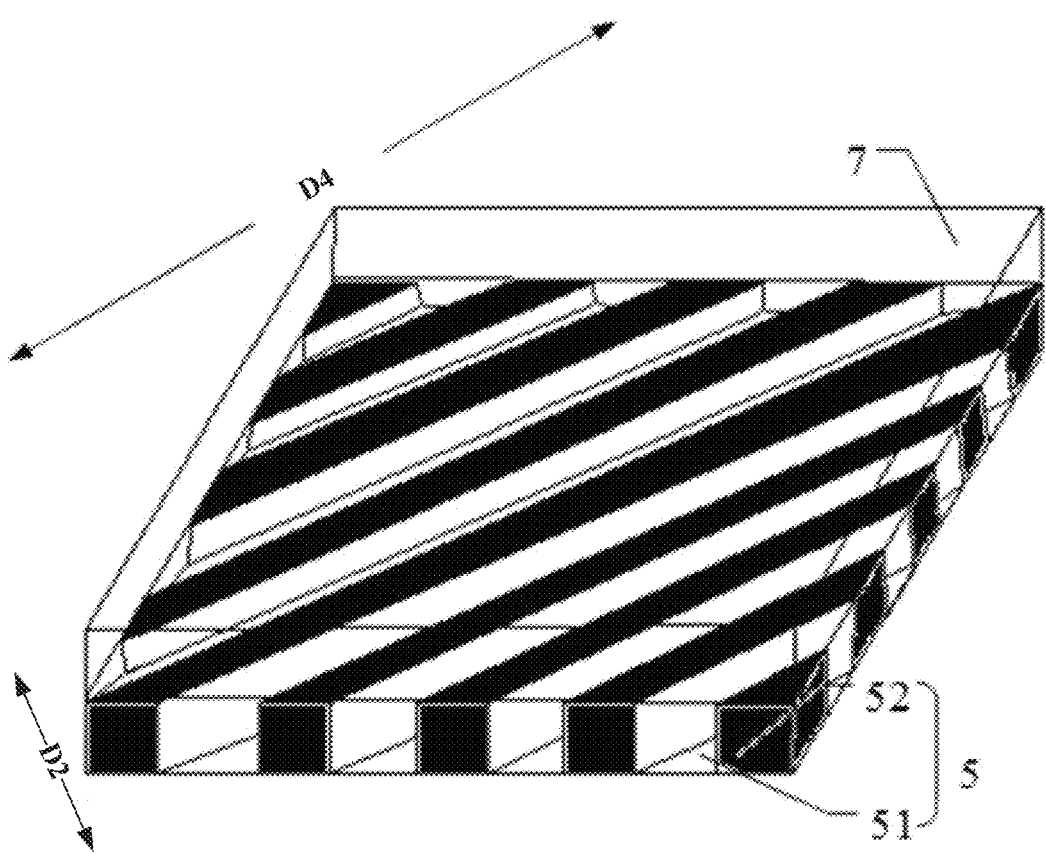
FIG. 6 is a perspective view of a second light shielding layer on an intermediate layer in some embodiments according to the present disclosure.

FIG. 2 is a plan view of a first light shielding layer and a second light shielding layer in some embodiments according to the present disclosure. FIG. 4A is a cross-sectional view of the first light shielding layer and the second light shielding layer along an A-A' line in FIG. 2. FIG. 4B is a cross-sectional view of the first light shielding layer and the second light shielding layer along a B-B' direction in FIG. 2. FIG. 4C is a cross-sectional view of a first light shielding layer and a second light shielding layer along a D-D' line in FIG. 2. FIG. 5 is a perspective view of a first light shielding layer on an intermediate layer in some embodiments according to the present disclosure. FIG. 6 is a perspective view of a second light shielding layer on an intermediate layer in some embodiments according to the present disclosure.

Referring to FIG. 4A and FIG. 5, in some embodiments, the first light shielding layer 4 includes a plurality of first light absorbing barriers 42 spaced apart from each other. Optionally, the plurality of first light absorbing barriers 42 are arranged along a first direction D1. Optionally, the plurality of first light absorbing barriers 42 extends along a third direction D3. Optionally, the plurality of first light absorbing barriers 42 are parallel to each other along the third direction D3.

Optionally, the plurality of first light absorbing barriers 42 are spaced apart by a plurality of first slits 401. Optionally, the plurality of first slits 401 are filed with a substantially transparent material to form a plurality of first light transmitting regions 41. For example, the plurality of first light absorbing barriers 42 and the plurality of first light transmitting regions 41 are alternatively arranged.

Optionally, referring to FIG. 4A, a first side 43 of a respective one of the plurality of first light absorbing barriers 42 connected to a side of the first light shielding layer 4 away from the counter substrate 101 is perpendicular to the side of the first light shielding layer 4 away from the counter substrate 101. For example, a cross-section of the respective one of the plurality of first light absorbing barriers 42 along the first direction D1 has a rectangular shape or a square shape.

Optionally, a first included angle is formed between the first side 43 of the respective one of the plurality of first light absorbing barriers 42 and the side of the first light shielding layer 4 away from the counter substrate 101. Optionally, the first included angle is smaller than 90°.

Referring to FIG. 4B and FIG. 6, in some embodiments, the second light shielding layer 5 includes a plurality of second light absorbing barriers 52 spaced apart from each other. Optionally, the plurality of second light absorbing barriers 52 are arranged along a second direction D2. Optionally, the plurality of second light absorbing barriers 52 extend along a fourth direction D4. For example, the plurality of second light absorbing barriers 52 are parallel to each other along the fourth direction D4.

Optionally, the plurality of second light absorbing barriers 52 are spaced apart by a plurality of second slits 501. Optionally, the plurality of second slits 501 are filed with a substantially transparent material to form a plurality of second light transmitting regions 51. For example, the plurality of second light absorbing barriers 52 and the plurality of second light transmitting regions 51 are alternatively arranged.

Optionally, referring to FIG. 4B, a second side 53 of a respective one of the plurality of second light absorbing barriers 52 connected to a side of the second light shielding layer 5 away from the counter substrate 101 is perpendicular to the side of the second light shielding layer 5 away from the counter substrate 101. For example, a cross-section of the respective one of the plurality of second light absorbing barriers 52 along the second direction D2 has a rectangular shape or a square shape.

Optionally, a second included angle is formed between the second side 53 of the respective one of the plurality of second light absorbing barriers 52 and the side of the second light shielding layer 5 away from the counter substrate 101. Optionally, the second included angle is smaller than 90°.

Optionally, referring to FIG. 3A to FIG. 6, the first light shielding layer 4 and the second light shielding layer 5 are sequentially stacked on a side of the plurality of photosensors 3 closer to the counter substrate 101 along a direction perpendicular to the counter substrate 101.

Optionally, the first direction D1 and the second direction D2 are different directions. For example, the first direction D1 and the second direction D2 are perpendicular to each other. Optionally, the third direction D3 and the fourth direction D4 are different directions. For example, the third direction D3 and the fourth direction D4 are perpendicular to each other.

Optionally, orthographic projections of the plurality of first light absorbing barriers 42 on the counter substrate 101 are perpendicular to orthographic projections of the plurality of second light absorbing barriers 52 on the counter substrate 101. Optionally, orthographic projections of the plurality of first light transmitting regions 41 on the counter substrate 101 are perpendicular to orthographic projections of the plurality of second light transmitting regions 51 on the counter substrate 101. Optionally, the orthographic projections of the plurality of first light absorbing barriers 42 on the counter substrate 101 are perpendicular to the orthographic projections of the plurality of second light transmitting regions 51 on the counter substrate 101. Optionally, the orthographic projections of the plurality of second light absorbing barriers 52 on the counter substrate 101 are perpendicular to the orthographic projections of the plurality of first light transmitting regions 41 on the counter substrate 101.

Optionally, orthographic projections of the plurality of first light absorbing barriers 42 on the counter substrate 101 intersect orthographic projections of the plurality of second light absorbing barriers 52 on the counter substrate 101. Optionally, orthographic projections of the plurality of first light transmitting regions 41 on the counter substrate 101 intersect orthographic projections of the plurality of second light transmitting regions 51 on the counter substrate 101. Optionally, the orthographic projections of the plurality of first light absorbing barriers 42 on the counter substrate 101 intersect the orthographic projections of the plurality of second light transmitting regions 51 on the counter substrate 101. Optionally, the orthographic projections of the plurality of second light absorbing barriers 52 on the counter substrate 101 intersect the orthographic projections of the plurality of first light transmitting regions 41 on the counter substrate 101.

Referring to FIG. 3A and FIG. 3B, in some embodiments, the plurality of first light absorbing barriers 42 and the plurality of second light absorbing barriers 52 cross over each other to form a plurality of intersection regions ISR and defining a plurality of light path apertures 6. Optionally, the plurality of intersection regions ISR are configured to block at least a portion of diffusedly reflected light from passing there-through. Optionally, the plurality of light path apertures 6 are configured to allow at least the portion of the light totally reflected by the surface of the counter substrate 101 away from the array substrate 1 to pass therethrough, to form a signal-enriched light beam.

Optionally, in a respective one of the plurality of intersection regions ISR, an orthographic projection of a respective one of the plurality of first light absorbing barriers 42 on the array substrate 1 overlaps with an orthographic projection of a respective one of the plurality of second light absorbing barriers 52 on the array substrate 1.

Optionally, the plurality of photosensors 3 are configured to detect the signal-enriched light beam to detect a fingerprint information.

Optionally, referring to FIG. 3A, a respective one of the plurality of light path apertures 6 is in the inter-subpixel region IR. Optionally, at least one of the plurality of light emitting elements LE is at least partially in the respective one of the plurality of intersection regions.

Optionally, referring to FIG. FIG. 3A to FIG. 2, the first light shielding layer 4 and the second light shielding layer 5 are in direct contact in the plurality of intersection regions ISR. Optionally, the plurality of first light absorbing barriers 42 and the plurality of second light absorbing barriers 52 are in direct contact in the plurality of intersection regions ISR.

In some embodiments, referring to FIG. 3A, when light is totally reflected by a region of the surface of the counter substrate 101, away from the array substrate 1, corresponding to a valley line of a fingerprint, and reaches the first light shielding layer 4, the totally reflected light continue to transmits through one of the plurality of first slits 401 (e.g., the plurality of first light transmitting regions 41), and the totally reflected light is filtered (e.g., collimated) by the one of the plurality of first slits 401, along the first direction D1, into a signal-enriched light bar. Optionally, the signal-enriched light bar continues to transmit through one of the plurality of second slits 501 (e.g., the plurality of second light transmitting regions 51), and the signal-enriched light bar is filtered (e.g., collimated) by the one of the plurality of second slits 501, along the second direction D2, into the signal-enriched light beam. So, the first light shielding layer 4 and the second light shielding layer 5 filter light along the first direction D1 and the second direction D2 to obtain the signal-enriched light beam.

In some embodiments, the first light shielding layer 4 and the second light shielding layer 5 include a black material. Optionally, the plurality of first light absorbing barriers 42 include a black material. Optionally, the plurality of second light absorbing barriers 52 includes a black material.

Various appropriate materials may be used as the black materials. Examples of materials used as the black material include, but are not limited to, black organic polymer materials, materials absorbing light having a selected wavelength ranges, and photoresistor materials. Optionally, the black organic polymer materials include ABS resin (e.g., acrylonitrile-butadiene-styrene copolymer). Optionally, the photoresistor materials include SU-8 photoresistor. For example, the plurality of first light absorbing barriers 42 or the plurality of second light absorbing barriers 52 are formed by patterning a photoresistor material layer, for example, the patterning process is performed by a nanoimprint process.

In some embodiments, the plurality of first light transmitting regions 41 include a substantially transparent material. Optionally, the plurality of second light transmitting regions 51 include a substantially transparent material.

As used herein, the term "substantially transparent" means at least 50 percent (e.g., at least 60 percent, at least 70 percent, at least 80 percent, at least 90 percent, and at least 95 percent) of an incident light transmitted there-through.

Various appropriate material may be used as the substantially transparent material. Examples of substantially transparent materials includes, but are not limited to, materials having a higher transmissive rate with respect to light having a selected wavelength range. For example, the substantially transparent material is transparent polyimide.

In some embodiments, referring to FIG. 4A to FIG. 6, the fingerprint sensing display apparatus further includes an intermediate layer 7. Optionally, the intermediate layer 7 is a transparent substrate. Optionally, the intermediate layer 7 is between the first light shielding layer 4 and the second light shielding layer 5.

For example, the plurality of first light absorbing barriers 42 is on a side of the intermediate layer 7 away from the plurality of second light absorbing barriers 52. The plurality of second light absorbing barriers 52 is on a side of the intermediate layer 7 away from the plurality of first light absorbing barriers 42. The plurality of first light absorbing barriers 42 and the plurality of second light absorbing barriers 52 cross over each other to form the plurality of intersection regions ISR and to define the plurality of light path apertures 6.

Various appropriate materials may be used for making the intermediate layer 7. Examples of materials suitable for making the intermediate layer 7 include, but are not limited to, substantially transparent polyimide and substantially transparent SiOx, allowing incident light transmitted therethrough.

In some embodiments, referring to FIG. 4C, the intermediate layer 7 is on a side of the first light shielding layer 4 away from the second light shielding layer 5. Optionally, the first light shielding layer 4 and the second light shielding layer 5 are in direct contact in the plurality of intersection regions ISR.

Optionally, the intermediate layer 7 is on a side of the second light shielding layer 5 away from the first light shielding layer 4.

Figure 4D:
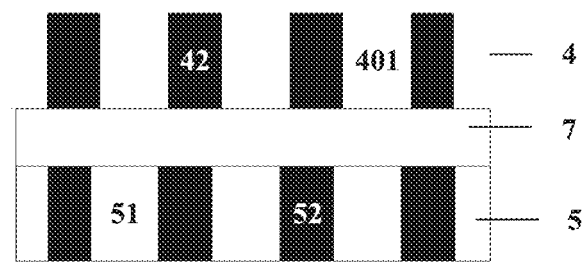
FIG. 4D is a cross-sectional view of the first light shielding layer and the second light shielding layer along a C-C' line in FIG. 2.

FIG. 4D is a cross-sectional view of the first light shielding layer and the second light shielding layer along a C-C' line in FIG. 2. In some embodiments, referring to FIG. 2 and FIG. 4D, in a cross section along the C-C' direction in FIG. 2, an orthographic projection of the plurality of light absorbing barriers 52 is respectively at least partially overlapping with the plurality of second light absorbing barriers 53.

Figure 7A:
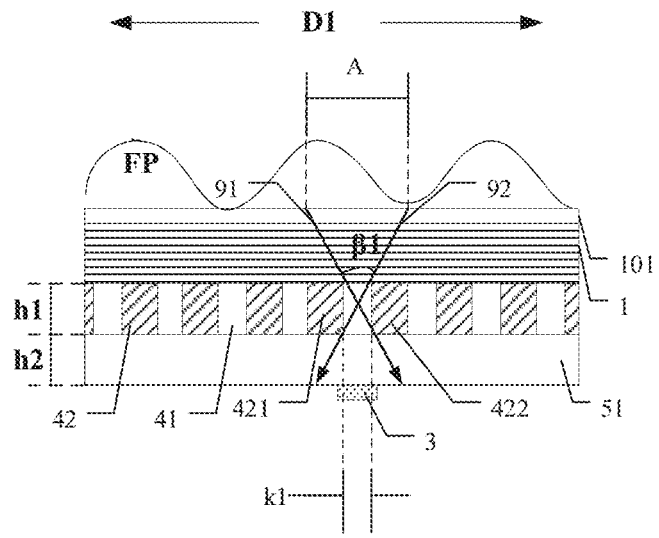
FIG. 7A is a schematic diagram illustrating a working principle of a first light shielding layer and a second light shielding layer in some embodiments according to the present disclosure.

FIG. 7A is a schematic diagram illustrating a working principle of a first light shielding layer and a second light shielding layer in some embodiments according to the present disclosure. Referring to FIG. 7A, the plurality of first light absorbing barriers 42 block at least the portion of diffusedly reflected light from passing therethrough, and allowing at least the portion of the light totally reflected by the surface of the counter substrate 101 away from the array substrate 1 to pass through the plurality of first slits 401 (e.g., the plurality of first light transmitting regions 41), which result in filtering out the diffusedly reflected light along the first direction D1 and filtering (e.g., collimating) the totally reflected light into a signal-enriched light bar.

For example, a first barrier 421 and a second barrier 422 of the plurality of first light absorbing barriers 42 allow a respective one of the plurality of photosensors 3 to detect light totally reflected by the region A of the counter substrate 101. Along the first direction D1, the first barrier 421 and the second barrier 422 not only filter out diffusedly reflected light, but also filter out the total reflected light from regions other than the region B of the counter substrate 101.

A first light receiving angle β1 of the first light shielding layer 4 is an included angle between two light beams in a same plane parallel to the first direction D1, and the two light beams have greatest incident angles with respect to the surface of the first light shielding layer 4 and transmit through a same one of the plurality of first slits 401 (e.g., the plurality of first light transmitting regions 41). For example, the first light receiving angle β1 of the light shielding layer 4 is an included angle between a first light 91 and the second light 92.

Optionally, a relationship between the first light receiving angle β1, a thickness of the respective one of the plurality of first slits 401 (e.g., the plurality of first light transmitting regions 41), and a thickness of the first light shielding layer 4 can be represented by the following equation:

$$h1=k1/\tan(\tfrac{1}{2}\beta1) \quad (1);$$

wherein h1 is the thickness of the first light shielding layer; k1 is a width, along the first direction, of the respective one of the plurality of first slits (e.g., the plurality of first light transmitting regions); β1 is the first light receiving angle of the second light shielding layer.

Figure 7B:
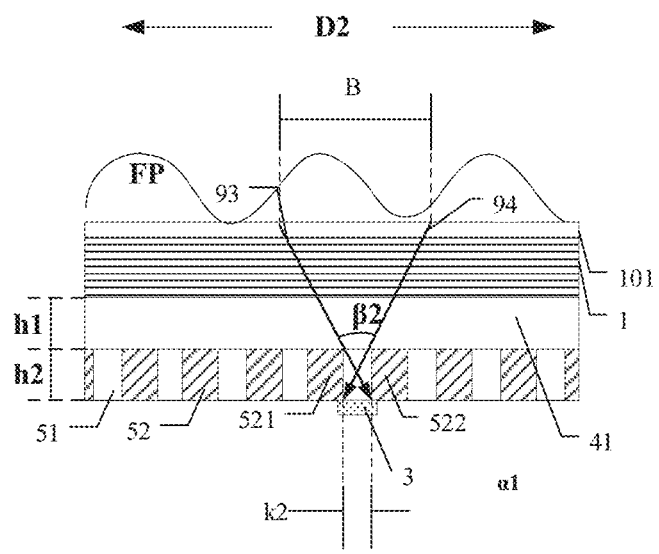
FIG. 7B is a schematic diagram illustrating a working principle of a first light shielding layer and a second light shielding layer in some embodiments according to the present disclosure.

FIG. 7B is a schematic diagram illustrating a working principle of a first light shielding layer and a second light shielding layer in some embodiments according to the present disclosure. Referring to FIG. 7B, the plurality of second light absorbing barriers 52 block at least the portion of diffusedly reflected light from passing therethrough, and allow at least the portion of the light totally reflected by the surface of the counter substrate 101 away from the array substrate 1 to pass through the plurality of second slits 501 (e.g., the plurality of second light transmitting regions 51), which result in filtering out the diffusedly reflected light along the second direction and filtering (e.g., collimating) the signal-enriched light bar into the signal-enriched light beam.

For example, a third barrier 521 and a fourth barrier 522 of the plurality of second light absorbing barriers 52 allow a respective one of the plurality of photosensors 3 to detect light totally reflected by the region B of the counter substrate 101. Along the second direction D2, the third barrier 521 and the fourth barrier 522 not only filter out total reflected light from regions other than the region B of the counter substrate 101, but also filter out the diffusedly reflected light.

A second light receiving angle β2 of the second light shielding layer 5 is an included angle between two light beams in a same plane parallel to the second direction D2, and the two light beams have greatest incident angles with respect to the surface of the second light shielding layer 5 and transmit through a same one of the plurality of second slits 501 (e.g., the plurality of second light transmitting regions 51). For example, the second light receiving angle β2 of the light shielding layer 5 is an included angle between a third light 93 and the fourth light 94.

Optionally, a relationship between the second light receiving angle β2, a thickness of the respective one of the plurality of second slits 501 (e.g., the plurality of second light transmitting regions 51), and a thickness of the second light shielding layer 5 can be represented by the following equation:

$$h2=k2/\tan(\tfrac{1}{2}\beta2) \quad (2);$$

wherein h2 is the thickness of the second light shielding layer; k2 is a width, along the second direction, of the respective one of the plurality of second slits (e.g., the plurality of second light transmitting regions); β2 is the second light receiving angle of the second light shielding layer.

In one example, ½β1 is 5.7°, k1 is 5 μm, and h1 is 50 μm. ½β2 is 5.7°, k2 is 5 μm, and h2 is 50 μm. According to the equation (1), the thickness h of the first light shielding layer is 50 μm, and according to the equation (2), the thickness h2 of the second light shielding layer is 50 μm.

Optionally, the intermediate layer is disposed between the first light shielding layer and the second light shielding layer, and a thickness of the intermediate layer is 10 μm. So, a sum of the thickness of the first light shielding layer, the thickness of the second light shielding layer, and the thickness of the intermediate layer is 110 μm. Optionally, a height of the respective one of the plurality of light path apertures equals to the sum of the thickness of the first light shielding layer, the thickness of the second light shielding layer, and the thickness of the intermediate layer, e.g., 110 μm.

In another example, k1=k2=10 μm, the sum of the thickness of the first light shielding layer, the thickness of the second light shielding layer, and the thickness of the intermediate layer is 210 μm.

Figure 8:
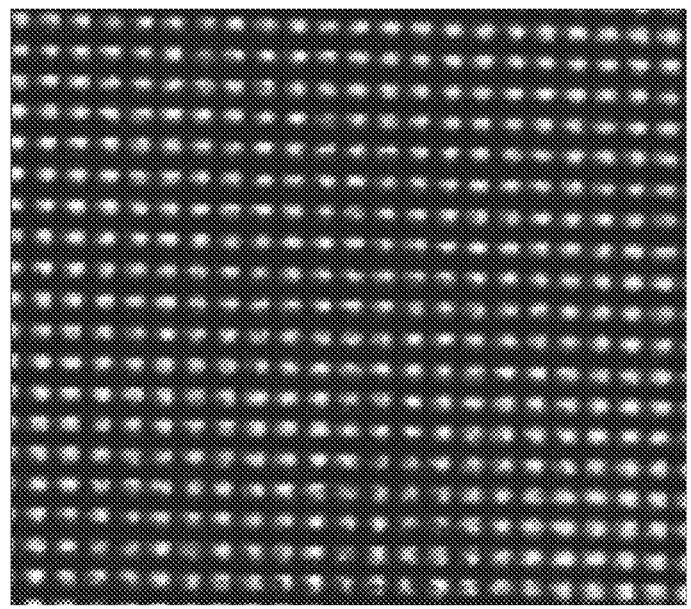
FIG. 8 is a scanning electron micrograph of a first light shielding layer and a second light shielding layer in some embodiments according to the present disclosure.

FIG. 8 is a scanning electron micrograph of a first light shielding layer and a second light shielding layer in some embodiments according to the present disclosure. FIG. 8 is a scanning electron micrograph of the first light shielding layer whose k1 is 10 μm and the second light shielding layer whose k2 is 10 μm.

Figure 9:
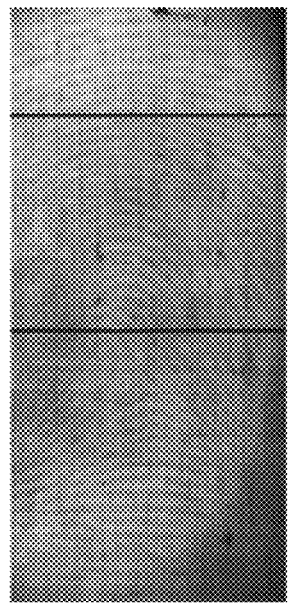
FIG. 9 is a schematic diagram illustrate a fingerprint sensing result obtained by using a fingerprint sensing display apparatus in some embodiments according to the present disclosure.

FIG. 9 is a schematic diagram illustrate a fingerprint sensing result obtained by using a fingerprint sensing display apparatus in some embodiments according to the present disclosure. FIG. 9 shows the fingerprint sensing result obtained using the first light shielding layer and the second light shielding layer shown in the FIG. 8. Valley lines and ridge lines of a fingerprint are easily distinguished from the fingerprint sensing result in FIG. 8.

Figure 10:
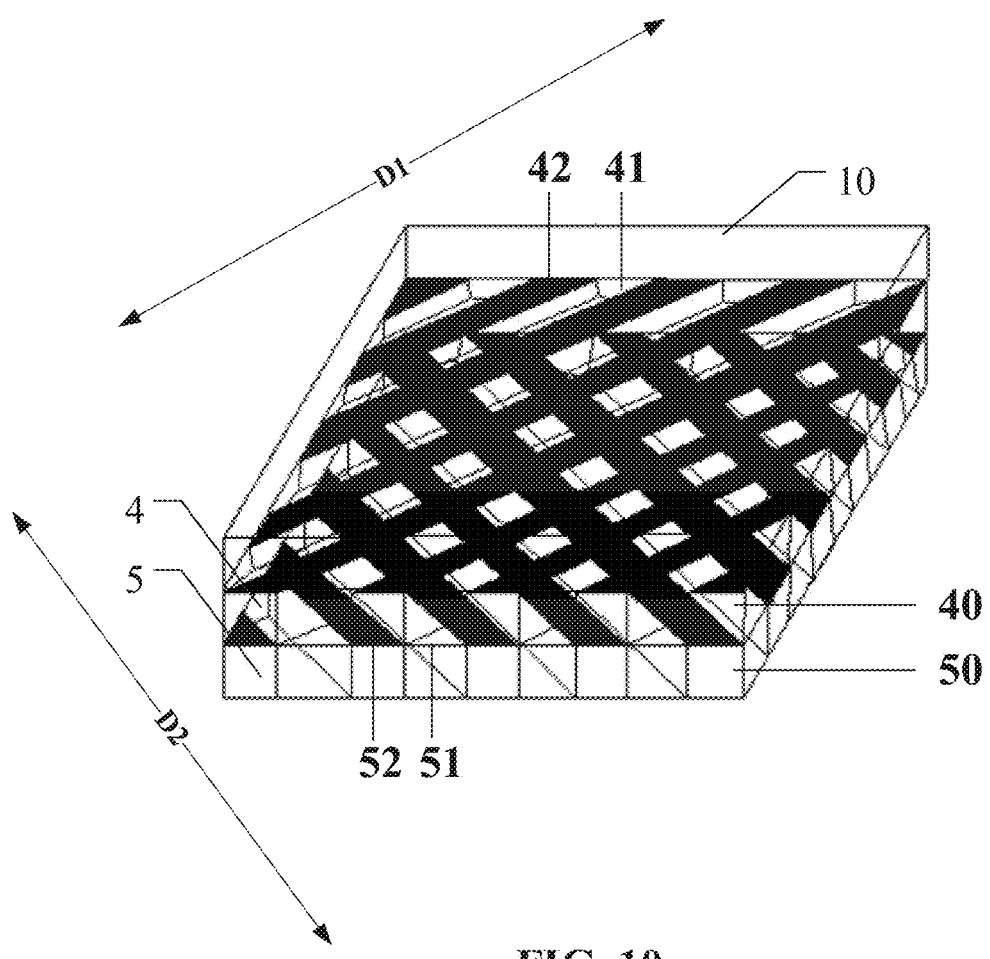
FIG. 10 is a schematic diagram of a structure of a first light shielding layer and a second light shielding layer in some embodiments according to the present disclosure.

FIG. 10 is a schematic diagram of a structure of a first light shielding layer and a second light shielding layer in some embodiments according to the present disclosure. Referring to FIG. 10, in some embodiments, the first light shielding layer 4 is on a side of a base substrate 10 in the array substrate 1 away from the counter substrate 101. For example, the base substrate 10 is a base substrate of an OLED substrate.

Optionally, the second light shielding layer 5 is formed on a side of the first light shielding layer 4 away from the base substrate 10.

In some embodiments, referring to FIG. 3C, the fingerprint sensing display apparatus further includes a plurality of gratings G between the plurality of photosensors 3 and the second light shielding layer 5. Optionally, the plurality of gratings G are configured to collimate the signal-enriched light beam.

In another aspect, the present disclosure also provides a method of using a fingerprint sensing display apparatus. In some embodiments, referring to FIG. 3A, FIG. 3B, and FIG. 2, the method of using the fingerprint sensing display apparatus described herein include emitting light toward a counter substrate 101 using a plurality of light emitting elements LE in an array substrate 1 facing the counter substrate 101; totally reflecting at least a portion of the light emitted from the plurality of light emitting elements LE using a surface of the counter substrate 101 away from the array substrate 1; blocking at least a portion of diffusedly reflected light from passing through a plurality of intersection regions ISR formed by a first light shielding layer 4 and a second light shielding layer 5; allowing at least the portion of the light totally reflected by the surface of the counter substrate 101 away from the array substrate 1 to pass through a plurality of light path apertures 6 defined by the first light shielding layer 4 and the second light shielding layer 5, thereby forming a signal-enriched light beam; and detecting the signal-enriched light beam using the plurality of photosensors 3 on a side of the array substrate 1 away from the counter substrate 101, thereby detecting a fingerprint information.

Optionally, the first light shielding layer 4 and the second light shielding layer 5 between the plurality of photosensors 3 and the plurality of light emitting elements LE. Optionally, the second light shielding layer 5 is on a side of the first light shielding layer 4 away from the plurality of light emitting elements LE.

Optionally, the first light shielding layer 4 includes a plurality of first light absorbing barriers 42 spaced apart from each other. Optionally, the plurality of first light absorbing barriers 42 are arranged along a first direction D1.

Optionally, the second light shielding layer 5 includes a plurality of second light absorbing barriers 52 spaced apart from each other. Optionally, the plurality of second light absorbing barriers 52 are arranged along a second direction D2.

Optionally, the plurality of first light absorbing barriers 42 and the plurality of second light absorbing barriers 52 cross over each other to form the plurality of intersection regions ISR and to define the plurality of light path apertures 6.

Optionally, in a respective one of the plurality of intersection regions ISR, an orthographic projection of a respective one of the plurality of first light absorbing barriers 42 on the array substrate 1 overlaps with an orthographic projection of a respective one of the plurality of second light absorbing barriers 52 on the array substrate 1.

In some embodiments, allowing at least the portion of the light totally reflected by the surface of the counter substrate 101 away from the array substrate 1 to pass through the plurality of light path apertures 6 further includes allowing at least the portion of the light totally reflected by the surface of the counter substrate 101 away from the array substrate 1 to pass through a plurality of first light transmitting regions 41 of the first light shielding layer 4 to form a signal-enriched light bar; and allowing at least a portion of the signal-enriched light bar to pass through a plurality of second light transmitting regions 51 to form the signal-enriched light beam.

In some embodiments, the at least the portion of the light totally reflected by the surface of the counter substrate away from the array substrate to pass through a plurality of first light transmitting regions of the first light shielding layer is a portion of light totally reflected by the surface of the counter substrate and transmitting along a direction corresponding to a first light receiving angle of the first light shielding layer. In some embodiments, the at least the portion of the signal-enriched light bar to pass through the plurality of second light transmitting regions are a portion of the signal-enriched light bar transmitting along a direction corresponding to a second light receiving angle of the second light shielding layer.

In some embodiments, referring to FIG. 7A, a first light receiving angle β1 of the first light shielding layer 4 is an included angle between two light beams in a same plane parallel to the first direction D1, and the two light beams have greatest incident angles with respect to the surface of the first light shielding layer 4 and transmit through a same one of the plurality of first slits 401 (e.g., the plurality of first light transmitting regions 41). For example, the first light receiving angle β1 of the light shielding layer 4 is an included angle between a first light 91 and the second light 92.

Optionally, a relationship between the first light receiving angle β1, a thickness of the respective one of the plurality of first slits 401 (e.g., the plurality of first light transmitting regions 41), and a thickness of the first light shielding layer 4 can be represented by the following equation:

$$h1 = k1/\tan(\tfrac{1}{2}\beta1) \qquad (1);$$

wherein h1 is the thickness of the first light shielding layer; k1 is a width, along the first direction, of the respective one of the plurality of first slits (e.g., the plurality of first light transmitting regions); and β1 is the first light receiving angle of the second light shielding layer.

In some embodiments, referring to FIG. 7B, a second light receiving angle β2 of the second light shielding layer 5 is an included angle between two light beams in a same plane parallel to the second direction D2, and the two light beams have greatest incident angles with respect to the surface of the second light shielding layer 5 and transmit through a same one of the plurality of second slits 501 (e.g., the plurality of second light transmitting regions 51). For example, the second light receiving angle β2 of the light shielding layer 5 is an included angle between a third light 93 and the fourth light 94.

Optionally, a relationship between the second light receiving angle β2, a thickness of the respective one of the plurality of second slits 501 (e.g., the plurality of second light transmitting regions 51), and a thickness of the second light shielding layer 5 can be represented by the following equation:

$$h2 = k2/\tan(\tfrac{1}{2}\beta 2) \qquad (2);$$

wherein h2 is the thickness of the second light shielding layer; k2 is a width, along the second direction, of the respective one of the plurality of second slits (e.g., the plurality of second light transmitting regions); β2 is the second light receiving angle of the second light shielding layer.

Figure 11A:
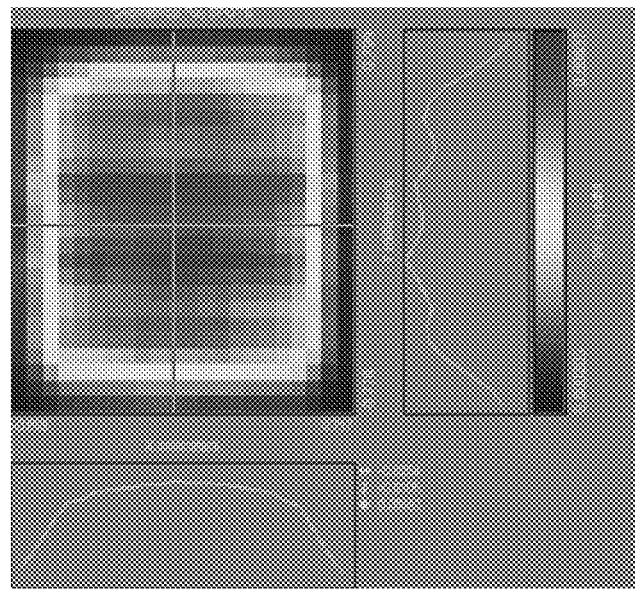
FIGS. 11A and 11B are optical simulation results using the first light shielding layer and the second light shielding layer in some embodiments according to the present disclosure.
Figure 11B:
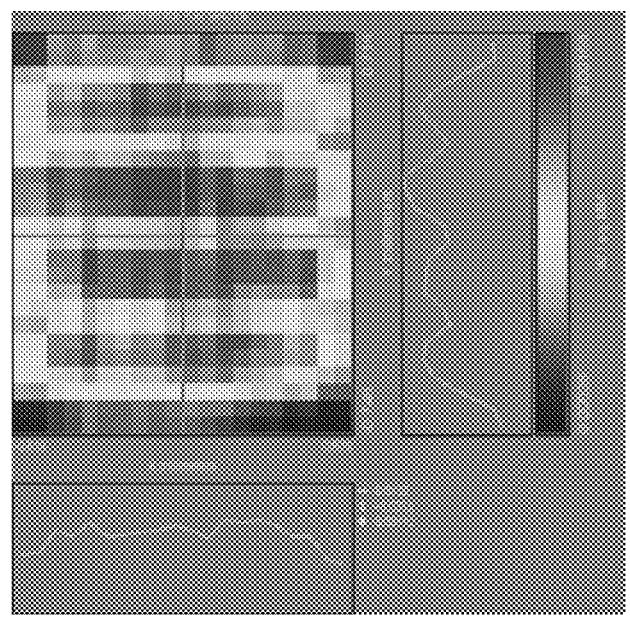

In one example, ½β1 is 5.7°, k1 is 5 μm, and h1 is 50 μm. ½β2 is 5.7°, k2 is 5 μm, and h2 is 50 μm. According to the equation (1), the thickness h1 of the first light shielding layer is 50 μm, and according to the equation (2), the thickness h2 of the second light shielding layer is 50 μm. FIGS. 1A and 1B are optical simulation results using the first light shielding layer and the second light shielding layer in some embodiments according to the present disclosure, the optical simulation results are generated using the first light shielding layer and the second light shielding layer having the above-recited parameters. In one example, a width of the respective one of the plurality of first light absorbing barriers 42 along the first direction is 2 μm, so that a pitch of the plurality of first light absorbing barriers 42 is 7 μm. As shown in FIGS. 11A and 11B, the first light shielding layer and the second light shielding layer are capable of collimating the signal-enriched light bars into the signal-enriched light beams, and filtering out the diffusedly reflected light. The signal-enriched light beams respectively correspond to the ridges and valleys of the fingerprint.

Optionally, the intermediate layer is disposed between the first light shielding layer and the second light shielding layer, and a thickness of the intermediate layer is 10 μm. So, a sum of the thickness of the first light shielding layer, the thickness of the second light shielding layer, and the thickness of the intermediate layer is 110 μm. Optionally, a height of the respective one of the plurality of light path apertures equals to the sum of the thickness of the first light shielding layer, the thickness of the second light shielding layer, and the thickness of the intermediate layer, e.g., 110 μm.

In another example, k1=k2=10 μm, the sum of the thickness of the first light shielding layer, the thickness of the second light shielding layer, and the thickness of the intermediate layer is 210 μm.

In another aspect, the present disclosure also provides a method of fabricating a fingerprint sensing display apparatus. In some embodiments, the method of fabricating the fingerprint sensing display apparatus include forming an array substrate including a plurality of light emitting elements; forming a counter substrate on the array substrate including a surface away from the array substrate configured to totally reflect at least a portion of light emitted from the plurality of light emitting elements; forming a first light shielding layer on a side of the plurality of light emitting elements away from the counter substrate; forming a second light shielding layer on a side of the first light shielding layer away from the plurality of light emitting elements; and forming a plurality of photosensors on a side of the second light shielding layer away from the first light shielding layer.

Optionally, the first light shielding layer is formed to have a plurality of first light absorbing barriers spaced apart from each other. Optionally, the plurality of first light absorbing barriers are arranged along a first direction.

Optionally, the second light shielding layer is formed to have a plurality of second light absorbing barriers spaced apart from each other. Optionally, the plurality of second light absorbing barriers are arranged along a second direction.

Optionally, the plurality of first light absorbing barriers and the plurality of second light absorbing barriers cross over each other to form a plurality of intersection regions configured to block at least a portion of diffusedly reflected light from passing there-through, and to define a plurality of light path apertures configured to allow at least the portion of the light totally reflected by the surface of the counter substrate away from the array substrate to pass therethrough, thereby forming a signal-enriched light beam.

Optionally, in a respective one of the plurality of intersection regions, an orthographic projection of a respective one of the plurality of first light absorbing barriers on the array substrate overlaps with an orthographic projection of a respective one of the plurality of second light absorbing barriers on the array substrate.

Optionally, the plurality of photosensors are configured to detect the signal-enriched light beam, thereby detecting a fingerprint information.

In some embodiments, forming the first light shielding layer includes forming a first light shielding material layer on the side of the plurality of light emitting elements away from the counter substrate; patterning the first light shielding material layer to form the plurality of first light absorbing barriers arranged along the first direction and a plurality of first slits arranged along the first direction, the plurality of first light absorbing barriers and the plurality of first slits being alternatively arranged; and forming a plurality of first light transmitting regions in the plurality of first slits, thereby forming the first light shielding layer. Optionally, the plurality of first light absorbing barriers and the plurality of first light transmitting regions are alternatively arranged. Optionally, the patterning process is performed by a nanoimprint process.

In some embodiments, forming the second light shielding layer includes forming a second light shielding material layer on the side of the first light shielding layer away from the plurality of light emitting elements; patterning the second light shielding material layer to form the plurality of second light absorbing barriers arranged along the second direction and a plurality of second slits arranged along the second direction, the plurality of second light absorbing barriers and the plurality of second slits being alternatively arranged; and forming a plurality of second light transmitting regions in the plurality of second slits, thereby forming the second light shielding layer. Optionally, the plurality of second light absorbing barriers and the plurality of second light transmitting regions are alternatively arranged. Optionally, the patterning process is performed by a nanoimprint process.

Optionally, the first direction and the second direction are different directions.

In one example, the method of fabricating the fingerprint sensing display apparatus described herein further includes forming an intermediate layer between the first light shielding layer and the second light shielding layer. Optionally, the intermediate layer is a substantially transparent substrate.

Figure 12A:
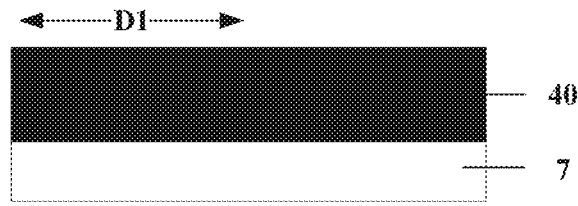
FIG. 12A to FIG. 12F are schematic diagrams illustrating a method of fabricating a first light shielding layer and a second light shielding layer in some embodiments according to the present disclosure.
Figure 12B:
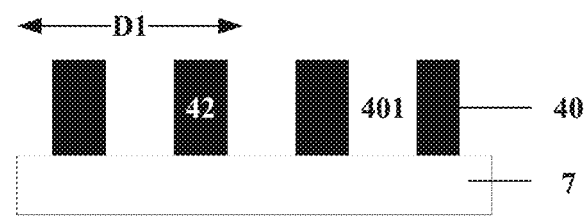
Figure 12C:
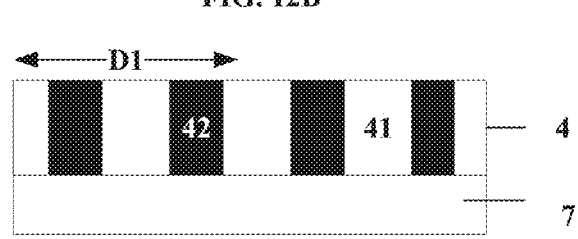

FIG. 12A to FIG. 12F are schematic diagrams illustrating a method of fabricating a first light shielding layer and a second light shielding layer in some embodiments according to the present disclosure. In some embodiments, referring to FIG. 12A, a first light shielding material layer 40 is formed on an intermediate layer 7. Referring to FIG. 12B, the first light shielding material layer 40 is patterned to form the plurality of first light absorbing barriers 42 arranged along the first direction D1 and the plurality of first slits 401 spacing apart the plurality of first light absorbing barriers 42. For example, the first light shielding materials layer 40 is patterned by a nanoimprint process. Referring to FIG. 12C, a first light transmitting material is filled in the plurality of first slits 401 to form a plurality of first light transmitting regions 41, thereby forming the first light shielding layer 4. Optionally, the first light shielding layer 4 is formed using processes including depositing, sputtering. Optionally, the first light transmitting material is a substantially transparent material.

Figure 12D:
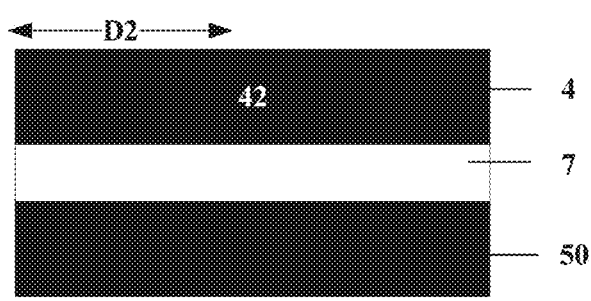
Figure 12E:
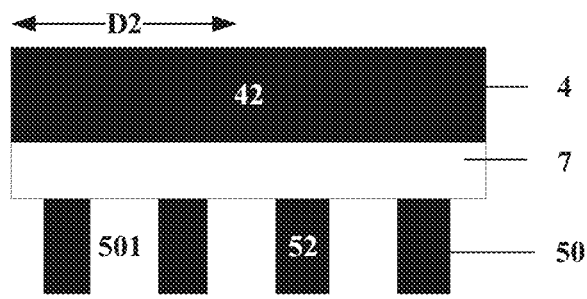
Figure 12F:
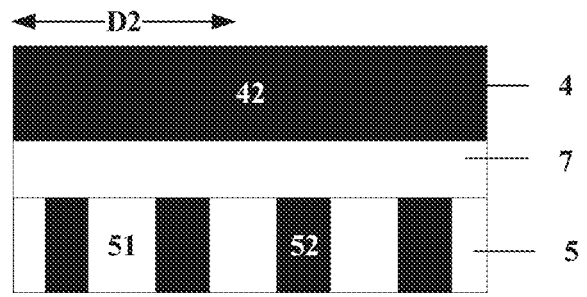

Referring to FIG. 12D, a second light shielding material layer 50 is formed on the intermediate layer 7. Referring to FIG. 12E, the second light shielding material layer 50 is patterned to form the plurality of second light absorbing barriers 52 arranged along the second direction D2 and the plurality of second slits 501 spacing apart the plurality of second light absorbing barriers 52. For example, the second light shielding material layer 50 is patterned by a nanoimprint process. Referring to FIG. 12F, a second light transmitting material is filled in the plurality of second slits 501 to form a plurality of second light transmitting regions 51, thereby forming the second light shielding layer 5. Optionally, the second light shielding layer 5 is formed using processes including depositing, sputtering. Optionally, the second light transmitting material is a substantially transparent material.

In another example, the method of fabricating the fingerprint sensing display apparatus described herein further includes forming an intermediate layer on a side of the first light shielding layer away from the second light shielding layer. Optionally, the intermediate layer is a substantially transparent substrate. Optionally, the intermediate layer is a base substrate of the array substrate.

FIG. 13A to FIG. 13H are schematic diagrams illustrating a method of fabricating a first light shielding layer and a second light shielding layer in some embodiments according to the present disclosure.

Figure 13A:
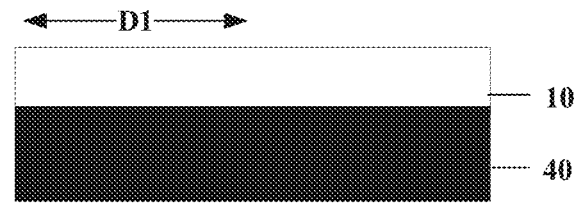
FIG. 13A to FIG. 13H are schematic diagrams illustrating a method of fabricating a first light shielding layer and a second light shielding layer in some embodiments according to the present disclosure.
Figure 13B:
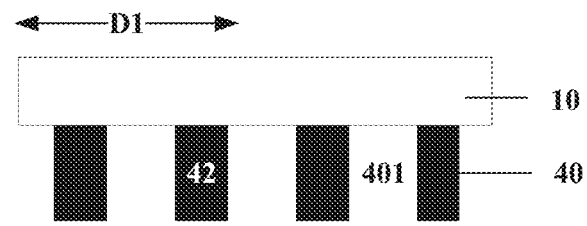
Figure 13C:
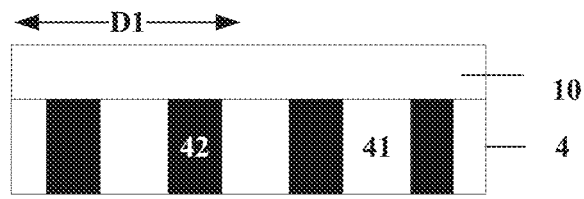

In some embodiments, referring to FIG. 10 and FIG. 13A, the first light shielding material layer 40 is formed on the side of the base substrate 10 (e.g., the intermediate layer) of the array substrate 1 away from the counter substrate 101. Referring to FIG. 13B, the first light shielding material layer 40 is patterned to form the plurality of first light absorbing barriers 42 arranged along the first direction D1 and the plurality of first slits 401 spacing apart the plurality of first light absorbing barriers 42. For example, the first light shielding material layer 40 is patterned by a nanoimprint process. Referring to FIG. 13C, the first light transmitting material is filled in the plurality of first slits 401 to form the plurality of first light transmitting regions 41, thereby forming the first light shielding layer 4.

Figure 13D:
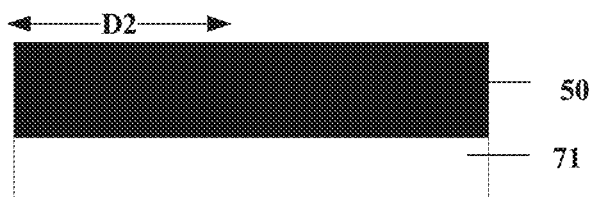
Figure 13E:
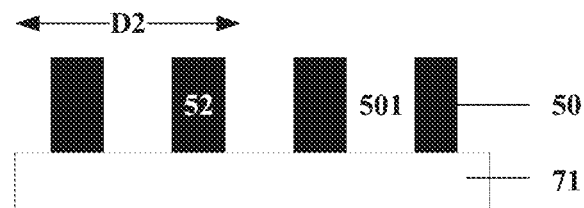
Figure 13F:
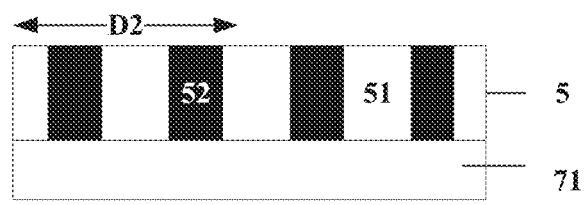
Figure 13G:
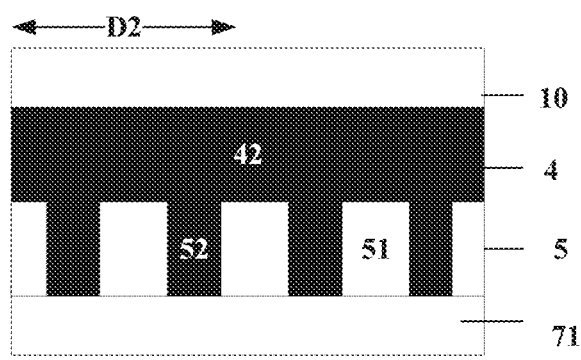
Figure 13H:
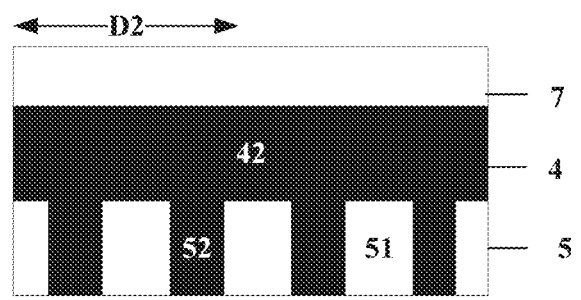

Referring to FIG. 13D, the second light shielding material layer 50 is formed on a mother substrate 71. FIG. 13E, the second light shielding material layer 50 is patterned to form the plurality of second light absorbing barriers 52 arranged along the second direction D2 and the plurality of second slits 501 spacing apart the plurality of second light absorbing barriers 52. For example, the second light shielding material layer 50 is patterned by a nanoimprint process. FIG. 13F, the second light transmitting material is filled in the plurality of second slits 501 to form a plurality of second light transmitting regions 51, thereby forming the second light shielding layer 5. FIG. 13G, the first light shielding layer 4 and the second light shielding layer 5 are aligned together, and the second light shielding layer 5 is transferred to the first light shielding layer 4. Referring to FIG. 13H, the mother substrate 71 is removed.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fingerprint sensing display apparatus having a plurality of subpixel regions spaced apart by an inter-subpixel region, comprising:
   a counter substrate;
   an array substrate facing the counter substrate,
   wherein the array substrate comprises
   a plurality of light emitting elements configured to emit light toward the counter substrate, at least a portion of the light being totally reflected by a surface of the counter substrate away from the array substrate;
   a plurality of photosensors on a side of the array substrate away from the counter substrate; and
   a first light shielding layer and a second light shielding layer between the plurality of photosensors and the plurality of light emitting elements, the second light shielding layer is on a side of the first light shielding layer away from the plurality of light emitting elements;
   wherein the first light shielding layer comprises a plurality of first light transmitting regions and a plurality of first light absorbing barriers alternatively arranged;

the second light shielding layer comprises a plurality of second light transmitting regions and a plurality of first light absorbing barriers alternatively arranged;

the plurality of first light absorbing barriers and the plurality of second light absorbing barriers cross over each other, forming a plurality of intersection regions, and defining a plurality of light path apertures;

in a respective one of the plurality of intersection regions, an orthographic projection of a respective one of the plurality of first light absorbing barriers on the array substrate overlaps with an orthographic projection of a respective one of the plurality of second light absorbing barriers on the array substrate;

at least one of the plurality of light emitting elements is completely limited in the respective one of the plurality of intersection regions, in which the fingerprint sensing display apparatus comprises a stacked structure comprising a portion of the respective one of the plurality of first light absorbing barriers, a portion of the respective one of the plurality of second light absorbing barriers, and the at least one of the plurality of light emitting elements.

2. The fingerprint sensing display apparatus of claim 1, wherein a respective one of the plurality of light path apertures is in the inter-subpixel region.

3. The fingerprint sensing display apparatus of claim 1, wherein the plurality of first light absorbing barriers are spaced apart from each other, and are arranged along a first direction;

the plurality of first light transmitting regions are spaced apart from each other, and are arranged along the first direction;

the plurality of second light absorbing barriers are spaced apart from each other, and are arranged along a second direction;

the plurality of second light transmitting regions are spaced apart from each other, and are arranged along the second direction;

the plurality of intersection regions are configured to block at least a portion of diffusedly reflected light from passing there-through;

the plurality of light path apertures are configured to allow at least the portion of the light totally reflected by the surface of the counter substrate away from the array substrate to pass therethrough, thereby forming a signal-enriched light beam; and the plurality of photosensors are configured to detect the signal-enriched light beam, thereby detecting a fingerprint information.

4. The fingerprint sensing display apparatus of claim 1, wherein, in the plurality of intersection regions, the first light shielding layer and the second light shielding layer are in direct contact.

5. The fingerprint sensing display apparatus of claim 1, further comprising an intermediate layer;

wherein the intermediate layer is a substantially transparent substrate; and the intermediate layer is between the first light shielding layer and the second light shielding layer.

6. The fingerprint sensing display apparatus of claim 1, further comprising an intermediate layer;

wherein the intermediate layer is a substantially transparent substrate; and the intermediate layer is on a side of the first light shielding layer away from the second light shielding layer.

7. The fingerprint sensing display apparatus of claim 6, wherein the intermediate layer is a base substrate of the array substrate.

8. The fingerprint sensing display apparatus of claim 1, wherein an orthographic projection of a respective one of the plurality of first light absorbing barriers on the counter substrate completely covers an orthographic projection of one row of light emitting elements on the counter substrate; and an orthographic projection of a respective one of the plurality of second light absorbing barriers on the counter substrate completely covers an orthographic projection of one column of light emitting elements on the counter substrate.

9. The fingerprint sensing display apparatus of claim 1, wherein the first light shielding layer and the second light shielding layer comprise a black material.

10. The fingerprint sensing display apparatus of claim 1, wherein the first light shielding layer comprises a plurality of first light transmitting regions configured to allow at least the portion of the light totally reflected by the surface of the counter substrate away from the array substrate to pass therethrough, thereby forming a signal-enriched light bar.

11. The fingerprint sensing display apparatus of claim 10, wherein the second light shielding layer comprises a plurality of second light transmitting regions configured to allow at least a portion of the signal-enriched light bar to pass therethrough, thereby forming the signal-enriched light beam.

12. The fingerprint sensing display apparatus of claim 1, wherein a thickness of the first light shielding layer satisfies the following condition:

$$h1 = k1/\tan(\tfrac{1}{2}\beta1) \tag{1};$$

a thickness of the second light shielding layer satisfies the following condition:

$$h2 = k2/\tan(\tfrac{1}{2}\beta2) \tag{2};$$

wherein h1 is a thickness of the first light shielding layer; k1 is a width, along the first direction, of a respective one of the the plurality of first light transmitting regions; and $\beta1$ is the first light receiving angle of the second light shielding layer; h2 is a thickness of the second light shielding layer; k2 is a width, along the second direction, of a respective one of the plurality of second light transmitting regions; $\beta2$ is the second light receiving angle of the second light shielding layer;

wherein the first light receiving angle $\beta1$ is an included angle between two first edge light beams in a same plane parallel to the first direction, the two first edge light beams are two light beams having greatest incident angles with respect to the surface of the first light shielding layer and transmitting through a same one of the plurality of first light transmitting regions; and the second light receiving angle $\beta2$ is an included angle between two second edge light beams in a same plane parallel to the second direction, the two second edge light beams are two light beams having greatest incident angles with respect to the surface of the second light shielding layer and transmitting through a same one of the plurality of second light transmitting regions.

13. The fingerprint sensing display apparatus of claim 12, wherein $\beta1$ is 11.4°, k1 is 5 μm, h1 is 50 μm, $\beta2$ is 11.4°, k2 is 5 μm, h2 is 50 μm, h1 is 50 μm, and h2 is 50 μm.

14. A method of fabricating a fingerprint sensing display apparatus having a plurality of subpixel regions spaced apart by an inter-subpixel region, comprising forming an array substrate comprising a plurality of light emitting elements;

forming a counter substrate on the array substrate comprising a surface away from the array substrate configured to totally reflect at least a portion of light emitted from the plurality of light emitting elements;

forming a first light shielding layer on a side of the plurality of light emitting elements away from the counter substrate;

forming a second light shielding layer on a side of the first light shielding layer away from the plurality of light emitting elements; and forming a plurality of photosensors on a side of the second light shielding layer away from the first light shielding layer;

wherein the first light shielding layer is formed to comprise a plurality of first light transmitting regions and a plurality of first light absorbing barriers alternatively arranged; and the second light shielding layer is formed to comprise a plurality of second light transmitting regions and a plurality of second light absorbing barriers alternatively arranged;

wherein the plurality of first light absorbing barriers and the plurality of second light absorbing barriers cross over each other to form a plurality of intersection regions, and to define a plurality of light path apertures;

in a respective one of the plurality of intersection regions, an orthographic projection of a respective one of the plurality of first light absorbing barriers on the array substrate overlaps with an orthographic projection of a respective one of the plurality of second light absorbing barriers on the array substrate;

at least one of the plurality of light emitting elements is completely limited in the respective one of the plurality of intersection regions, in which the fingerprint sensing display apparatus comprises a stacked structure comprising a portion of the respective one of the plurality of first light absorbing barriers, a portion of the respective one of the plurality of second light absorbing barriers, and the at least one of the plurality of light emitting elements.

15. The method of fabricating the fingerprint sensing display apparatus of claim 14, wherein forming the first light shielding layer comprises forming a first light shielding material layer on the side of the plurality of light emitting elements away from the counter substrate;

patterning the first light shielding material layer to form the plurality of first light absorbing barriers arranged along the first direction and a plurality of first slits arranged along the first direction, the plurality of first light absorbing barriers and the plurality of first slits being alternatively arranged; and forming the plurality of first light transmitting regions in the plurality of first slits, thereby forming the first light shielding layer;

wherein the plurality of first light absorbing barriers and the plurality of first light transmitting regions are alternatively arranged.

16. The method of fabricating the fingerprint sensing display apparatus of claim 15, wherein forming the second light shielding layer comprises forming a second light shielding material layer on the side of the first light shielding layer away from the plurality of light emitting elements;

patterning the second lights shielding material layer to form the plurality of second light absorbing barriers arranged along the second direction and a plurality of second slits arranged along the second direction, the plurality of second light absorbing barriers and the plurality of second slits being alternatively arranged; and forming the plurality of second light transmitting regions in the plurality of second slits, thereby forming the second light shielding layer;

wherein the plurality of second light absorbing barriers and the plurality of second light transmitting regions are alternatively arranged.

17. The method of fabricating the fingerprint sensing display apparatus of claim 16, wherein patterning the first light shielding material layer is performed by a nanoimprint process, and patterning the second light shielding material layer is performed by a nanoimprint process.

18. The method of fabricating the fingerprint sensing display apparatus of claim 14, further comprising:

forming an intermediate layer between the first light shielding layer and the second light shielding layer;

wherein the intermediate layer is a substantially transparent substrate.

19. The method of fabricating the fingerprint sensing display apparatus of claim 14, further comprising:

forming an intermediate layer on a side of the first light shielding layer away from the second light shielding layer;

wherein the intermediate layer is a substantially transparent substrate.

20. The method of fabricating the fingerprint sensing display apparatus of claim 19, wherein the intermediate layer is a base substrate of the array substrate.

* * * * *